(12) United States Patent
Shimura

(10) Patent No.: US 7,192,166 B2
(45) Date of Patent: Mar. 20, 2007

(54) LENS HAVING FRESNEL LENS SURFACE(S) AND LIGHTING APPARATUS USING IT

(75) Inventor: Takashi Shimura, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 11/076,439

(22) Filed: Mar. 10, 2005

(65) Prior Publication Data
US 2005/0201101 A1 Sep. 15, 2005

(30) Foreign Application Priority Data
Mar. 10, 2004 (JP) ............................ P2004-068166

(51) Int. Cl.
F21V 5/00 (2006.01)
F21V 5/04 (2006.01)

(52) U.S. Cl. .................... 362/331; 362/244; 362/332; 362/333

(58) Field of Classification Search .............. 362/237, 362/240, 243, 244, 311, 326, 330, 331, 332, 362/333, 334, 335, 336, 337, 338, 339, 340, 362/800; 359/741, 742, 743
See application file for complete search history.

(56) References Cited

U.S. PATENT DOCUMENTS

| | | | | |
|---|---|---|---|---|
| 3,797,915 A | * | 3/1974 | Land et al. | 359/742 |
| 5,160,192 A | * | 11/1992 | Sugawara | 362/333 |
| 5,490,049 A | * | 2/1996 | Montalan et al. | 362/240 |
| 5,588,743 A | * | 12/1996 | Mayo et al. | 362/327 |
| 6,084,670 A | * | 7/2000 | Yamazaki et al. | 359/741 |
| 2004/0149940 A1 | * | 8/2004 | Buisker et al. | 250/559.36 |

FOREIGN PATENT DOCUMENTS

JP 02010394 * 1/1990 ........ 345/FOR. 147

* cited by examiner

Primary Examiner—Y. My Quach-Lee
(74) Attorney, Agent, or Firm—Browdy and Neimark, PLLC (57) ABSTRACT

A lens comprising a transparent member having at least two surfaces, and a Fresnel lens surface provided on each of the two surfaces of the transparent member, the transparent member including a generally plate-like shape having a first surface and a second surface opposing the first surface, the Fresnel lens surface being provided on each of the first and second surfaces of the transparent member.

4 Claims, 9 Drawing Sheets

LENS HAVING FRESNEL LENS SURFACE(S) AND LIGHTING APPARATUS USING IT

CROSS-REFERENCE TO THE RELATED APPLICATION

The application claims the priority benefit of Japanese Patent Application No.2004-68166, filed on Mar. 10, 2004, the entire descriptions of which are incorporated herein by reference.

BACKGROUND OF THE INVENTION

1. Field of the Invention

The present invention relates to an improvement in a lens having Fresnel lens surface(s) and a lighting apparatus using the improved lens.

2. Related Art Statement

Conventionally, many of lighting apparatuses used in various optical application instruments for reading and writing a CD or DVD and the like are structured so as to have a predetermined property to focus light emitted from light source(s) such as LED element(s) or lamp(s) by attaching a lens to a support provided with the light source(s), or by forming a lens integrally with the support.

In order to thin such a lighting apparatus, the light source(s) must be disposed dose to the lens, and the lens is required to have a greater power of light focusing and a larger aperture, in other words, a smaller F-number. As the lens, there has been used a transparent member formed into a generally semi-spherical convex lens, or a transparent member having a semispherical convex lens part and a prismatic portion in which a plurality of concentric circle-like prisms are arranged on an outer peripheral section of the convex lens part without increasing the thickness of the lens.

A Fresnel lens surface here means a surface which comprises a convex lens part and a series of coaxial fine prisms formed coaxially to a central axis of the convex lens part on an outer periphery of the convex lens part.

In addition, F-number means an inverse number of relative aperture in an optical system such as a lens. Relative aperture means a ratio between a diameter of lens aperture and a focal length of the lens.

Figure 8:
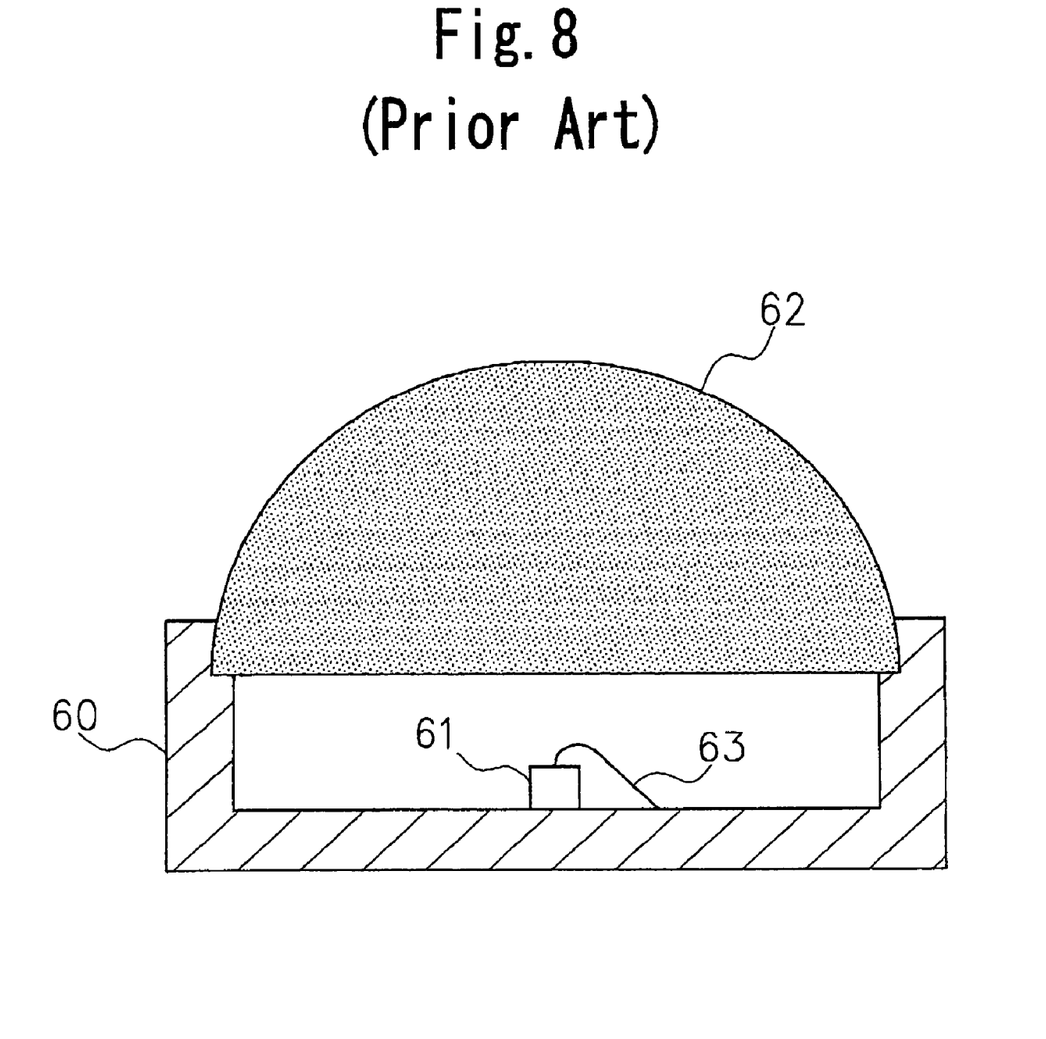
FIG. 8 is a sectional view showing a first conventional lighting apparatus using a semi-spherical lens.

FIG. 8 illustrates a first conventional lighting apparatus. The lighting apparatus has a case 60 made of a resin, an LED 61 which is disposed in the case and which corresponds to a light source, and a semispherical lens 62 supported on the case 60 so as to face the LED. Reference number 63 denotes a bonding wire to connect the LED 61 and an electrode not shown in the figure. In the lighting apparatus, the semispherical lens 62 fulfills a good light-focusing function, but there is a problem that the semispherical lens 62 increases in thickness because the semispherical lens has a large lens aperture and a large curvature. Thus, the lighting apparatus cannot be miniaturized, particularly in terms of thickness.

Figure 9A:
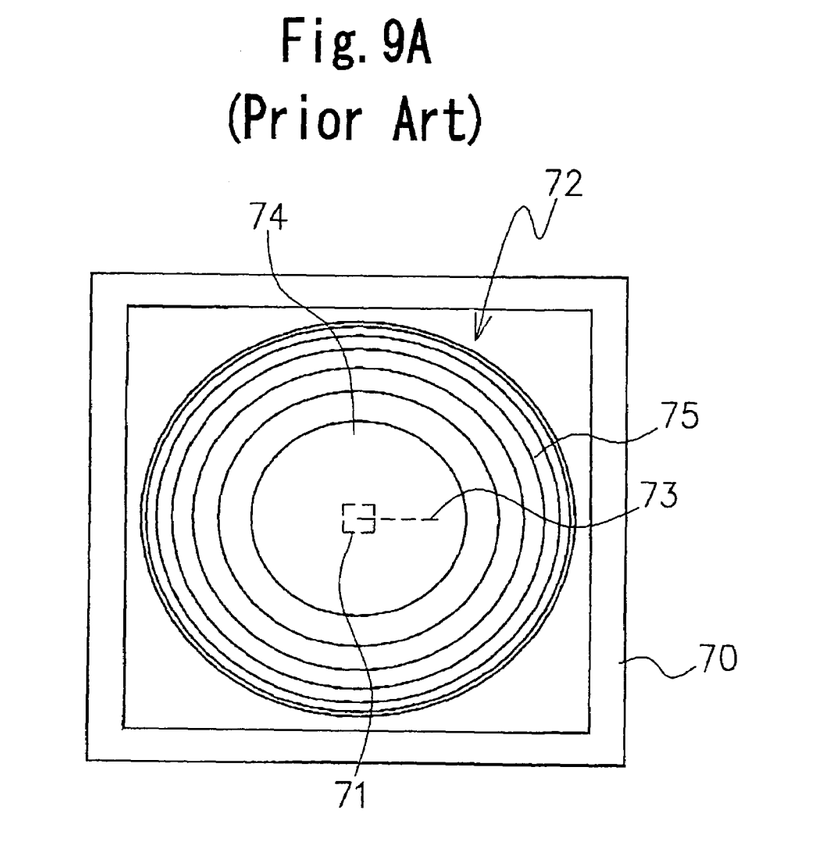
FIG. 9A is a plan view showing a second conventional lighting apparatus using a lens having a Fresnel lens surface.
Figure 9B:
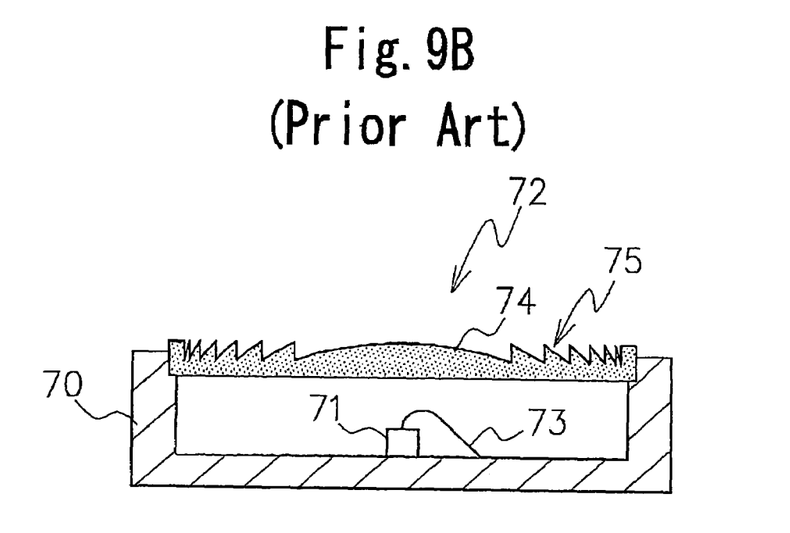
FIG. 9B is a sectional view of FIG. 9A

FIGS. 9A and 9B illustrate a second conventional lighting apparatus. The lighting apparatus has a case 70, an LED 71 as a light source disposed in the case and a lens 72 supported on the case 70 so as to face the LED and having a refracting-type Fresnel lens surface. Reference number 73 denotes a bonding wire to connect the LED 71 and an electrode not shown in the figure.

The lens 72 has a Fresnel lens surface in which one convex lens 74 and a prismatic portion 75 having a plurality of ring-shaped prisms coaxial with a central axis or optical axis of the convex lens 74 are provided, an inclined surface of each prismatic portion is a straight line or a curved line copying an original lens surface or making a touch of correction to a shape in order to correct a refracting characteristic partially, apexes of the prisms are aligned to have approximately the same height, respectively and the prismatic portion 75 have a shape of wave rings in a plan view. Therefore, the entire thickness of the convex lens is decreased by removing excess areas of the lens, while maintaining the lens functions of the prismatic portion 75 and a central section of the lens.

The lens 72 having the Fresnel lens surface can be decreased in thickness in case of having the same lens aperture and the same F-number as the semi-spherical lens 62, has as shown in FIG. 8, and the lighting apparatus is decreased in thickness accordingly. However, in FIGS. 9A and 9B, an inclination of the inclined surface of each prism is sharper as going to an outer peripheral section of the lens, and a space between the adjacent prisms is also lesser. Therefore, the manufacturing process of surfaces of the prismatic portion 75, in other words, cutting process of dies for lens is difficult, and there is a problem of limitation in the manufacturing process of the prismatic portion, especially at a position out of a radius of the lens, when the lens has a large aperture. The angle between the light incident and the axis of lens increases at the peripheral parts of the lens. As a result, there is a problem that the light efficiency decreases at the peripheral parts.

Figure 10A:
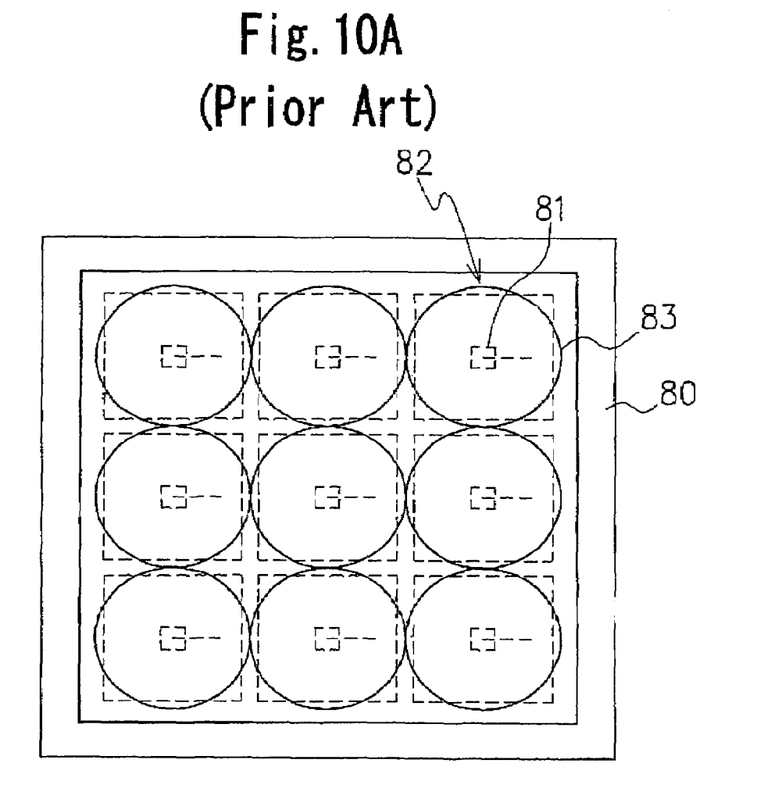
FIG. 10A is a plan view showing a third conventional lighting apparatus using a semi-spherical lens array and a plurality of LED elements.
Figure 10B:
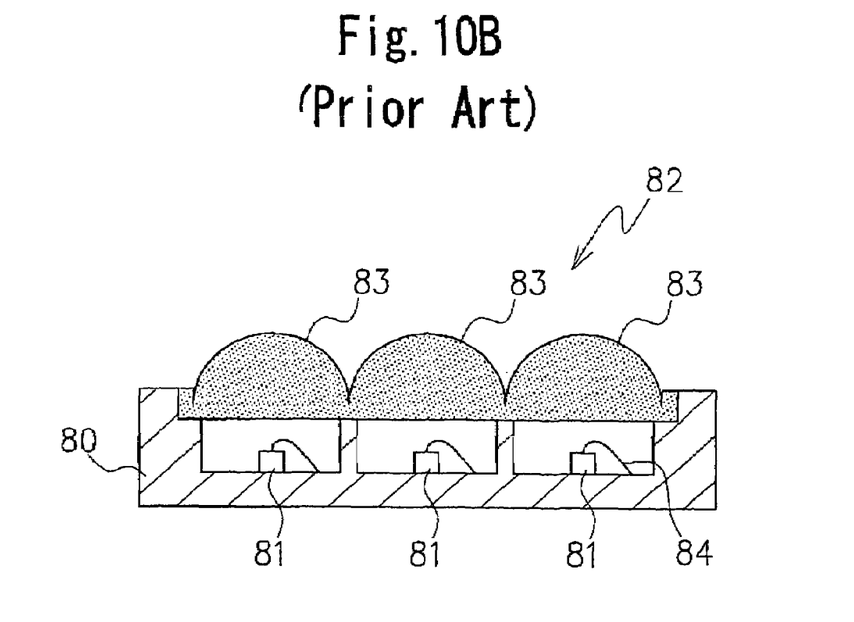
FIG. 10B is a sectional view of FIG. 10A

FIGS. 10A and 10B illustrate a third conventional lighting apparatus. The lighting apparatus has a case 80, a plurality of LEDs 81 disposed in the case, and a lens array member 82 supported on the case 80 so that each lens 83 of the lens array 82 faces each of the LEDs 81. The lens array member 82 comprises a plurality of semispherical lenses 83 arranged independently and dose to each other in a planar state. Each LED 81 is disposed on an optical axis of each semispherical lens 83. Meanwhile, reference number 84 denotes a bonding wire to connect each LED 81 and an electrode not shown in the figure. This conventional lighting apparatus has a high illumination effect with an appropriate light focus. However, it is difficult to thin the lens array member 82 and lighting apparatus in this conventional example, similar to the first conventional example.

Figure 11A:
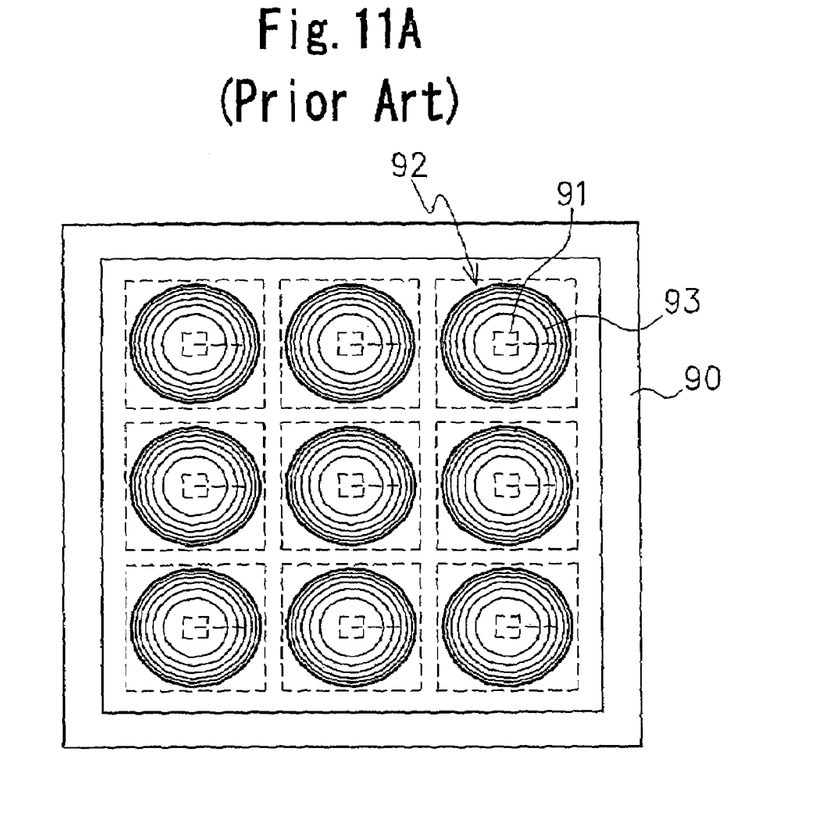
FIG. 11A is a plan view showing a fourth conventional lighting apparatus using a lens array having a plurality of independent Fresnel lens surface and a plurality of LED elements.
Figure 11B:
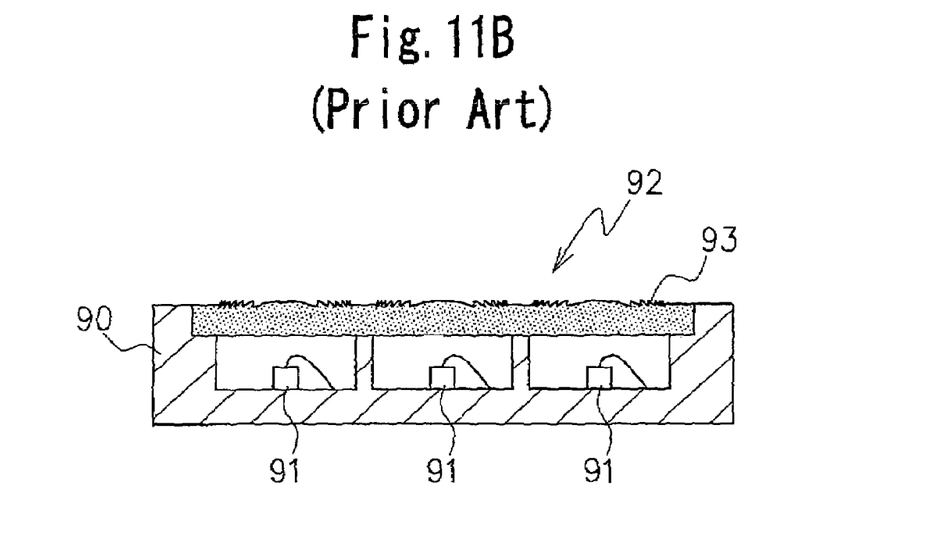
FIG. 11B is a sectional view of FIG. 11A

FIGS. 11A and 11B illustrate a fourth conventional lighting apparatus. The lighting apparatus has substantially the same object as in the third conventional lighting apparatus. The lighting apparatus has a plurality of LEDs 91 disposed in a case 90, and a lens array member 92 supported on the case 90. The lens array member 92 has a plurality of Fresnel lens surfaces 93 disposed so that each Fresnel lens surface 93 faces each of the LEDs 91. The lighting apparatus can be thinned, but there is a limitation to the manufacturing process, similar to the second conventional example.

Figure 12A:
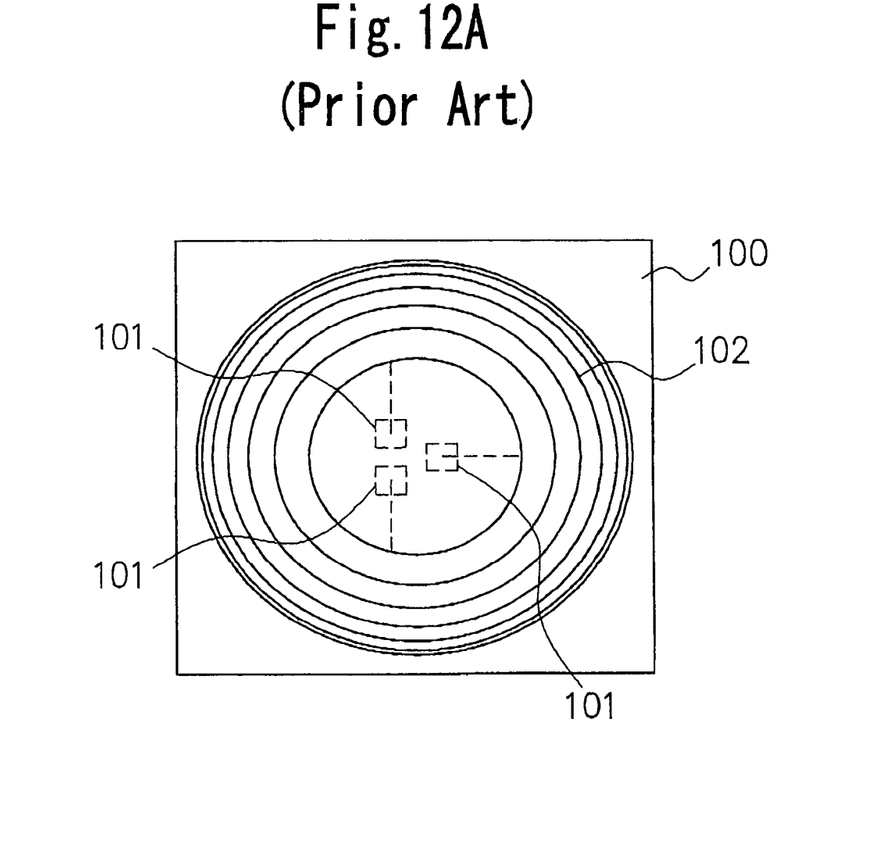
FIG. 12A is a plan view showing a fifth conventional lighting apparatus using a lens having a Fresnel lens surface and multiple-color LED elements.
Figure 12B:
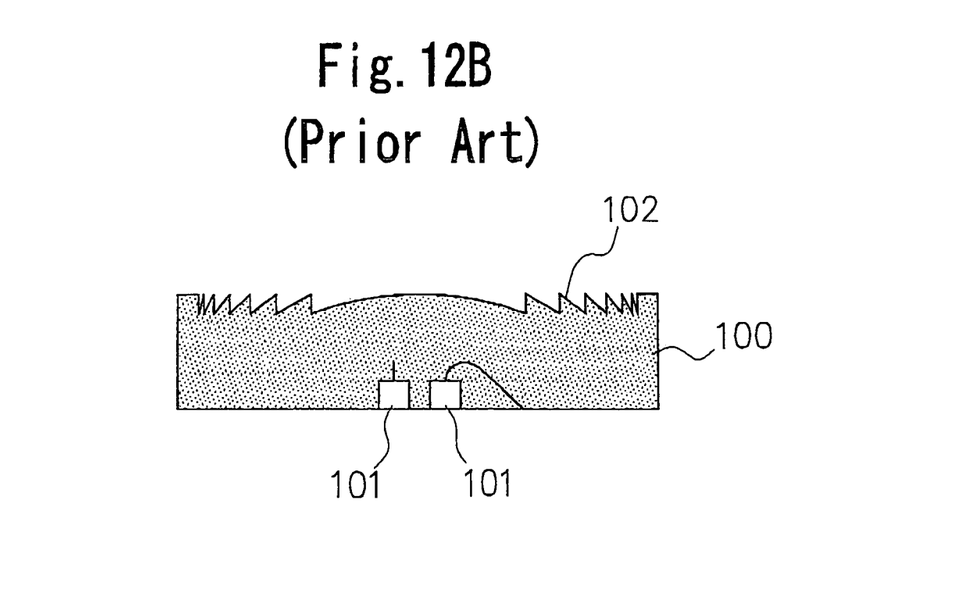
FIG. 12B is a sectional view of FIG. 12A

FIGS. 12A and 12B illustrate a fifth conventional lighting apparatus. In the lighting apparatus, a plurality of LEDs 101 which are three LEDs and each of which emits each color of R, G and B, for example here. The three LEDs 101 are disposed close to one another and located directly below a center part of a lens 100 to obtain any color of light. Here, reference number 102 denotes prismatic portion of the lens 100. The LEDs 101 are embedded in the lens 100. A main problem in a lighting apparatus using the lens 100 is that the plurality of LEDs cannot be disposed on an optical axis of the lens simultaneously. Therefore, the lens having a single optical lens cannot optimize the light emissions from all of the LEDs 101.

SUMMARY OF THE INVENTION

Therefore, a first object of the present invention is to provide a lens in which a plurality of Fresnel lens surfaces are combined and which has a lot of flexibility in design, and a lighting apparatus using the lens and improving the performance of a lens.

A second object of the present invention is to provide a lens having a greater refracting power than a conventional lens having a Fresnel lens surface, and also, the lens having a structure without a manufacturing limitation of the Fresnel lens surface, and also, the lens having a thinned lighting apparatus using the lens.

A third object of the present invention is to provide a lens including a Fresnel lens surface having a structure capable of imparting an optimum lens shape to a plurality of light sources, which are adjacent to one another and a lighting apparatus using the lens.

According to an embodiment of the present invention, a lens includes a transparent member having at least two surfaces, and a Fresnel lens surface provided on each of the surfaces of the transparent member.

According to another embodiment of the present invention a lens includes a transparent member, and a plurality of Fresnel lens surfaces provided on at least one of the surfaces of the transparent member. Central axes of the plurality of Fresnel lens surfaces deviate mutually by a predetermined distance.

According to still another embodiment, a lens includes a transparent member having at least two surfaces, and a Fresnel lens surface provided on at least one of the surfaces of the transparent member. The Fresnel lens surface includes a curved surface provided on the transparent member and a plurality of prismatic parts provided on the curved surface.

DETAILED DESCRIPTION OF THE PREFERRED EMBODIMENTS

Preferred embodiments of the present invention will be explained with reference to the accompanying drawings below.

Figure 1:
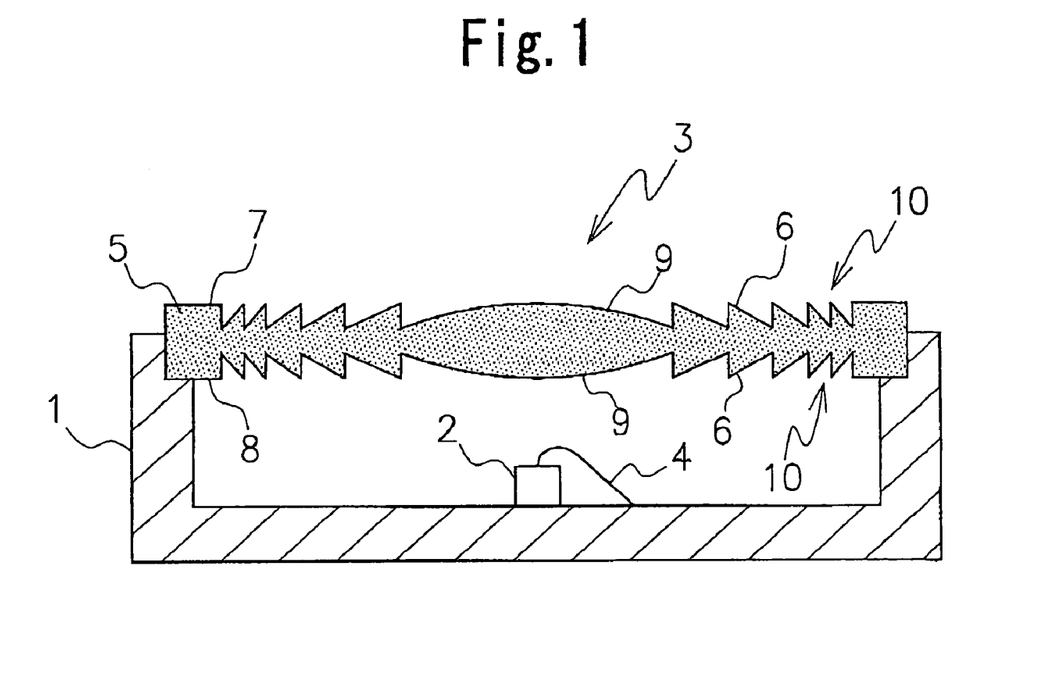
FIG. 1 is a sectional view showing a first embodiment of a lens having two Fresnel lens surfaces and a lighting apparatus according to the present invention.

FIG. 1 illustrates a first embodiment of a lighting apparatus according to the present invention in which a lens having two Fresnel lens surfaces is applied. The lighting apparatus shown in the embodiment comprises a case 1, a light source 2 disposed in the case 1, and a lens 3 disposed to face the light source 2 and fixed to the case 1 by a suitable means. The light source 2 comprises an LED in this embodiment. Reference number 4 denotes a bonding wire to connect the LED.

The lens 3 includes a transparent member 5 having at least two surfaces, and a Fresnel lens surface 6 provided on each of the two surfaces of the transparent member 5. In the embodiment, the transparent member 5 has a generally plate-like shape, on a first surface thereof for example, an upper surface 7 and a second surface thereof, for example, a lower surface 8 the Fresnel lens surface 6 is provided on each of upper and lower surfaces respectively. In the embodiment, since the upper and lower surfaces 7 and 8 of the transparent member 5 are flat, the Fresnel lens surface 6 is formed on each of the flat upper and lower surfaces. Each of the Fresnel lens surfaces 6 includes a semispherical convex lens surface 9, for example, provided on a central section of the transparent member 5, and a prismatic portion 10 comprising a plurality of generally triangular prisms provided circumferentially on an outer peripheral section of the convex lens surface 9, in the embodiment. A central axis of the Fresnel lens surface 6 provided on the upper surface 7 and a central axis of the Fresnel lens surface 6 provided on the lower surface 8 are disposed coaxially.

In the embodiment, because each Fresnel lens surface 6 may have a half of a comprehensively required light-focusing power, an apex angle of each prism of the prismatic portion 10 may be much obtuse than that in the second conventional example. Accordingly, the prismatic portion 10 can be formed without a limitation of processing, especially at the peripheral part of the lens, and a diameter of each prismatic portion 10 can be sufficiently large. Therefore, a lighting apparatus using a lens according to the present invention can have a larger lens aperture than a lighting apparatus using a conventional lens, or if a lens according to the present invention and a conventional lens are compared and the both of the lenses have the same aperture, the F-number of the lens according to the present invention can be smaller. In addition, it is possible to allow a light source such as an LED to be disposed relatively closer to the lens 3, and thereby the lighting apparatus may decrease in thickness.

Figure 2:
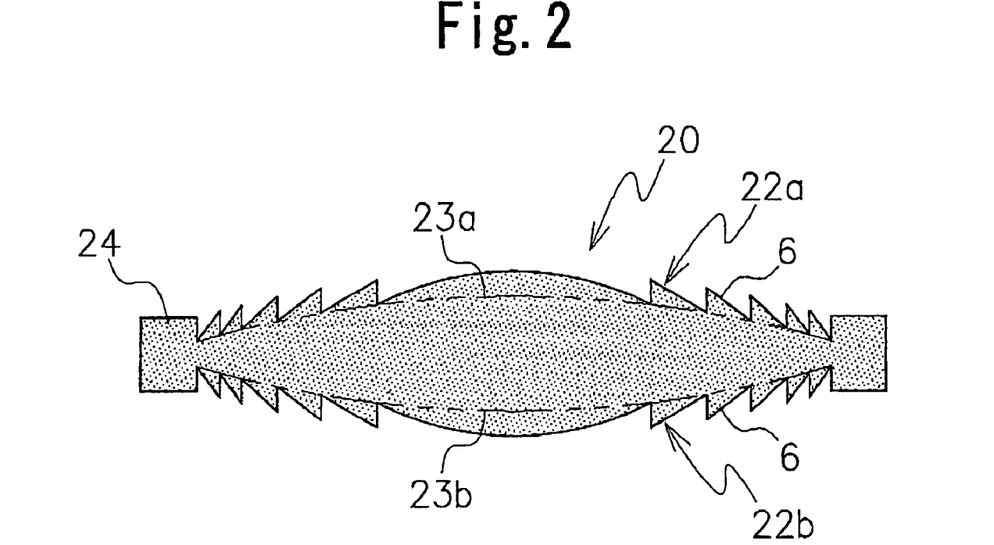
FIG. 2 is a sectional view showing a second embodiment of the lens according to the present invention.

FIG. 2 illustrates a second embodiment of the lens according to the present invention.

The lens 20 has basal planes 23a and 23b of upper and lower prismatic portions 22a and 22b which are shown in FIG. 2 are formed into spherical convex surfaces. The basal planes 23a and 23b are different from the flat basal planes of the lens 3 in FIG. 3. More specifically, the transparent member 24 in the embodiment has a configuration in which an upper surface corresponding to the basal plane 23a of the prismatic portions 22a and a lower surface corresponding to the basal plane 23b of the prismatic portions 22b have convexly curved shapes, respectively, and the Fresnel lens surfaces 6 are formed on the curved upper and lower surfaces. Thus, providing the Fresnel lens surfaces on the upper and lower convexly curved surfaces can make a combined focal position of the lens be further shortened.

Meanwhile, the curved surface making the basal plane of the prisms may be provided on one surface of the transparent member 24, for example, the upper surface only. A shape of the curved surfaces is not limited to the convex shape, may be formed to have any curve and any characteristic may be added to the lens for the purpose of compensating for weak points of the lens depending on an objective of the lens, for example, an improvement in the light-focusing power of the lens, a correction to a kind of aberration, an improvement in the direction of the incident light on the prisms of the lens or the like. The curved surfaces are not needed to share a common central axis with the lens. Moreover, if the basal plane 23b facing the light source has a concave shape, the incidence of light on the prismatic portion 22b is facilitated, and the light efficiency can be improved.

Figure 3:
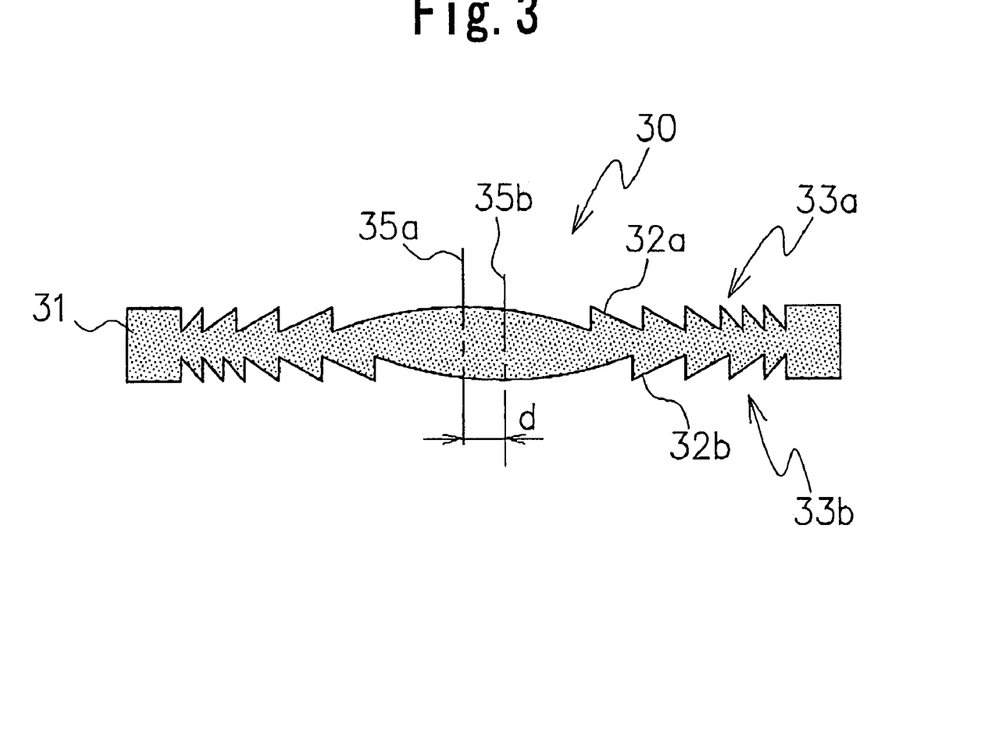
FIG. 3 is a sectional view showing a third embodiment of the lens according to the present invention.

FIG. 3 illustrates a third embodiment of the lens according to the present invention.

A lens 30 in this embodiment has a configuration in which central axes or optical axes 35a and 35b of prismatic portions 33a and 33b in Fresnel lens surfaces 32a and 32b provided on upper and lower surfaces of a transparent member 31 are eccentric with respect to each other. The reason of this configuration is for adjusting the focusing property of the lens 30.

Figure 4:
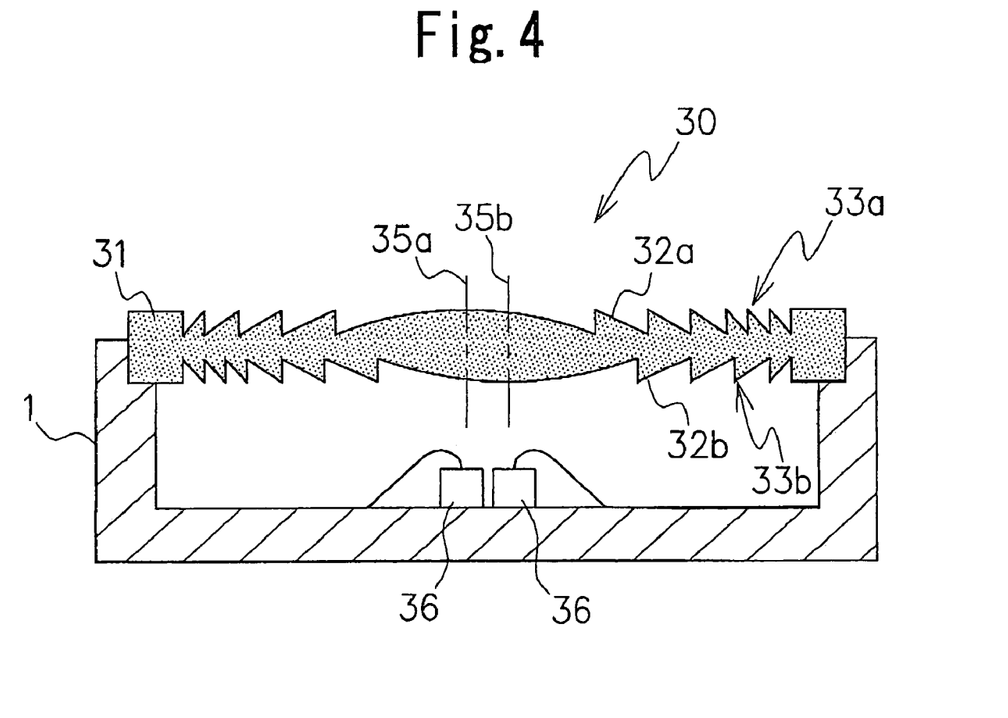
FIG. 4 is a sectional view showing a lighting apparatus to which the third embodiment of the lens according to the present invention is applied.
Figure 5:
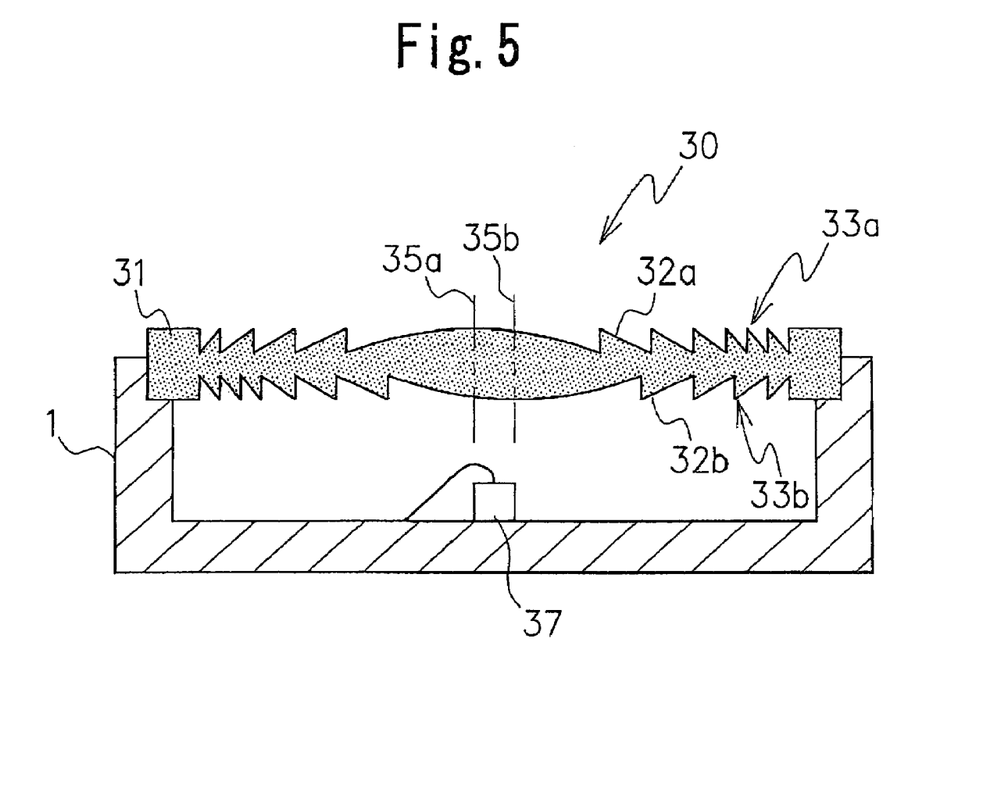
FIG. 5 is a sectional view showing a modified example of the lighting apparatus to which the third embodiment of the lens according to the present invention is applied.

FIGS. 4 and 5 illustrate two examples of a lighting apparatus, in each of which a lens 30 is assembled in a case 1. FIG. 4 illustrates the lighting apparatus in which each of two LEDs 36 is disposed approximately on extension of each of two central axes 35a and 35b of the Fresnel lens surfaces. FIG. 5 illustrates the lighting apparatus in which one LED 37 is disposed in an approximately intermediate area of the extended two central axes 35a and 35b.

Figure 6:
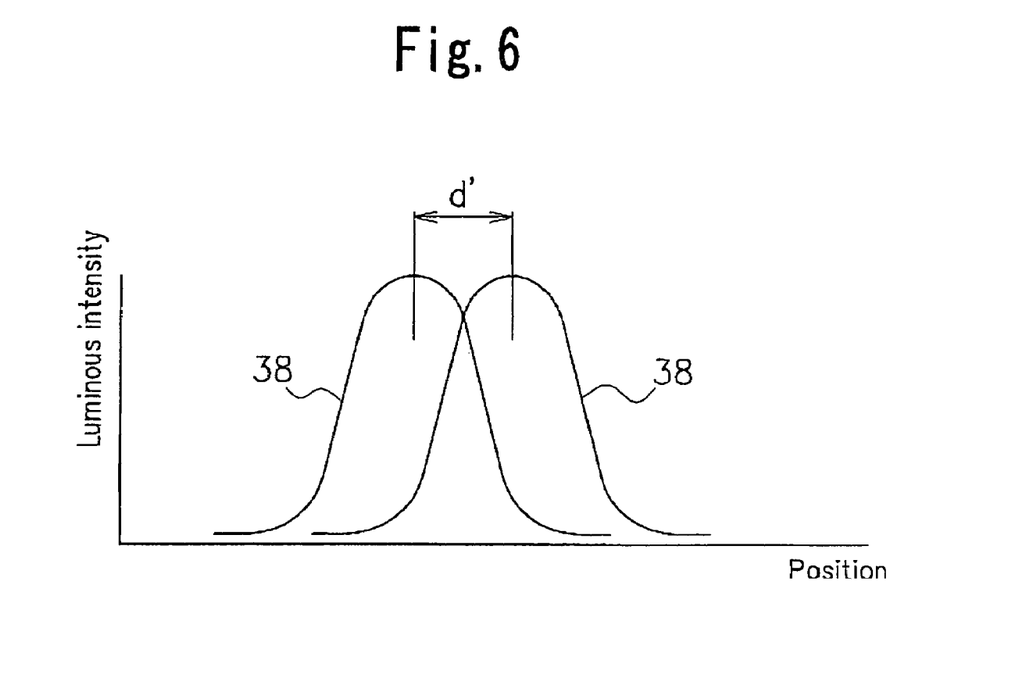
FIG. 6 is a graph showing a light-focusing effect in the lighting apparatus to which the third embodiment of the lens according to the present invention is applied

FIG. 6 is a graph showing a light-focusing effect of the lens in the third embodiment of the present invention.

In FIG. 6, reference number 38 shows two light-focusing curves. The light-focusing curves show a distribution of light intensity through the lens 30, and the light is emitted from one LED 37 or adjacently disposed two LEDs. The two light-focusing curves 38 are dislocated and separated by a distance (d') corresponding to a misalignment (d) between the optical axes of the two lenses. A shape of the curves does not equal necessarily depending on a position or number of the light source, and other conditions. Usually, the (d') is not equal with the (d). Because the emitted light from the LED 37 passes through both the upper and lower Fresnel lens surfaces 32a and 32b. The overall light through the lens has a light-focusing curve whose shape is similar to a sum of the light-focusing curves 38.

As a result, an illuminated surface through the lens has two optical axes. In other words, to widen the illuminated surface having a uniform light intensity is possible.

Figure 7A:
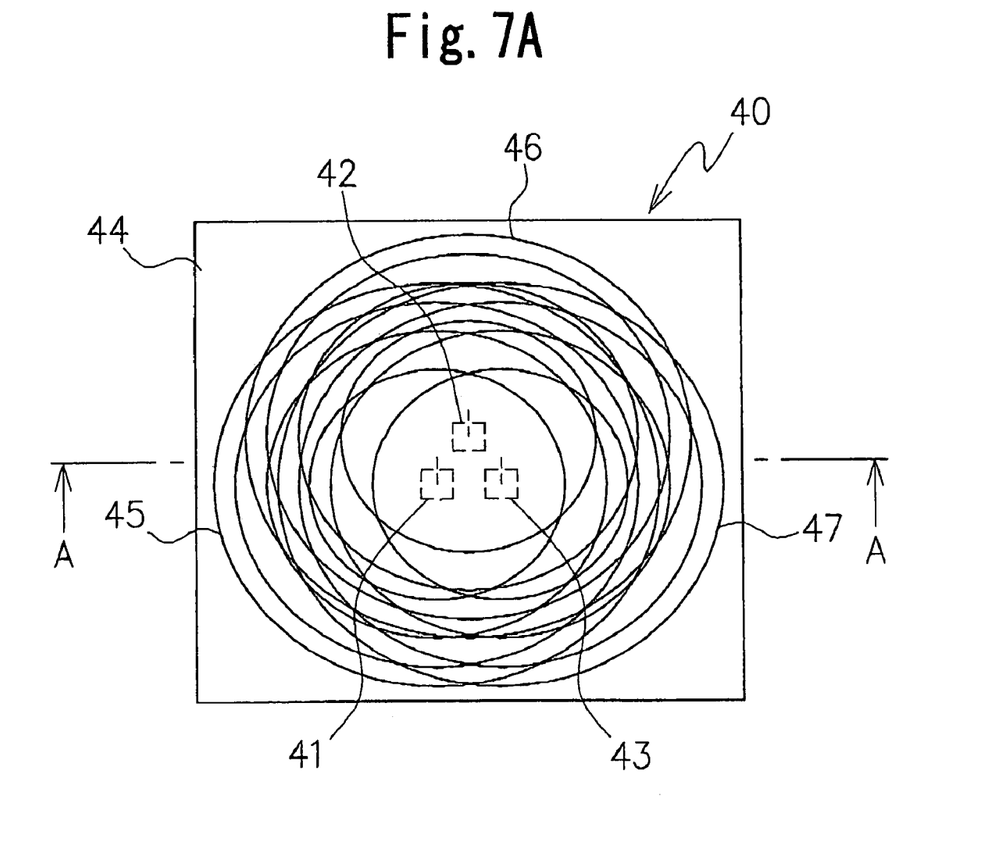
FIG. 7A is a plan view showing a fourth embodiment of the lens and the lighting apparatus according to the present invention.
Figure 7B:
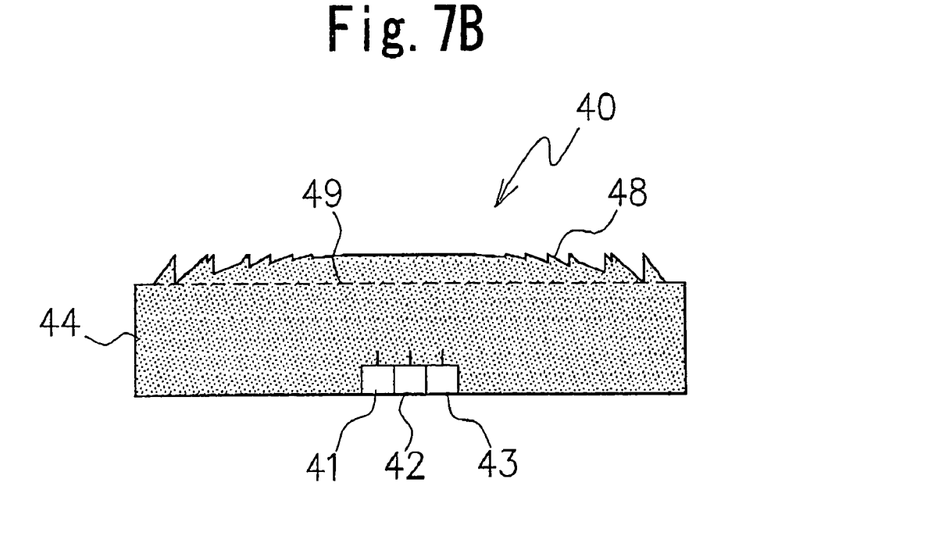
FIG. 7B is a sectional view taken along A—A line in FIG. 7A

FIGS. 7A and 7B illustrate a fourth embodiment of the lens according to the present invention and a lighting apparatus using the lens.

The fourth embodiment corresponds to the fifth conventional example described in FIG. 12, in which, three LEDs 41, 42 and 43 are embedded in a lens 40. The lens in the fourth embodiment, however, has a plurality of Fresnel lens surfaces, that is different from the lens in the conventional example. A transparent member 44 has three, for example, Fresnel lens surfaces 45, 46 and 47 provided on one surface thereof, for example an upper surface only. The Fresnel lens surfaces 45, 46 and 47 have triple surfaces all together and the central axes of the triple Fresnel lens surfaces are eccentrically arranged mutually. Actually, each radial pitch between the adjacent concentric prisms 48 is fine sufficiently, but it is depicted roughly in FIG. 7B for the sake of illustration. Central axes of the three Fresnel lens surfaces 45, 46 and 47 are substantially arranged to be positioned at apexes of a generally regular triangle in a plan view. Moreover, a center of each emission surface of the LEDs 41, 42 and 43 is located on each central axis of the three Fresnel lens surfaces. The three LEDs 41, 42, and 43 are configured to emit light of R (red), G (green) and B (blue), respectively.

Although sectional surfaces of the lens can form into various structures in portions where wave rings of prisms on the three Fresnel lens surfaces intersect. In this embodiment, the lens has a profile in which prismatic portions projecting from a basal plane 49 are arranged continuously, as shown in FIG. 7B. In this way, because each Fresnel lens surface is located directly above each LED in the embodiment, the light emission of each LED can be optimized. Also, designs of the lens are facilitated. Moreover, a wider illumination surface can be obtained by the added effects of prisms of other Fresnel lens surfaces which are not positioned directly above each LED. In addition, each Fresnel lens surface may be formed on a basal plane having a curved surface, and formed on each of upper and lower surfaces of the lens. Furthermore, the position of the emission surface of each LED may be disposed eccentrically to the optical axis of each Fresnel lens surface suitably.

According to the present invention, by combining at least two Fresnel lens surfaces, even a single thin lens can obtain a highly suitable light-focusing effect. The lens can have a lot of flexibility in design. For example, apex angles of prisms at the periphery on the Fresnel lens surfaces can be less acute, and can even maintain the sufficient light-focusing power, by providing a plurality of Fresnel lens surfaces on the upper and lower surfaces of a lens. Therefore, lens having a larger aperture ratio which overcomes the limitation of manufacturing can be obtained. Moreover, a further flexibility in design can be obtained by forming Fresnel lens surfaces having eccentric central axes in the upper and lower Fresnel lens surfaces or the same plane. In addition, by providing those kinds of Fresnel lens surface on a curved surface, light-focusing effects can be further increased or compensated. A lighting apparatus using a lens having at least one of the above-mentioned characteristics obtain effects such as an optimum light-focusing power and a thin thickness of the lens.

Not shown in the embodiments here, however, a lighting apparatus may use a lens array shown in a conventional example of FIGS. 11A and 11B, for example, and each of the plurality of lenses on the lens array may have at least two Fresnel lens surfaces respectively to achieve the objectives of the present invention.

Meanwhile, new embodiments or modifications can be structured by combining the characteristics in the embodiments. Furthermore, any additional modified embodiments can be structured by using the known technology.

What is claimed is:

1. A lens, comprising:
a transparent member including a generally plate-like shape having a first surface and a second surface opposing the first surface;
a Fresnel lens surface provided on each of the first and second surfaces of the transparent member;
wherein a central axis of the Fresnel lens surface provided on the first surface of the transparent member and a central axis of the Fresnel lens surface provided on the second surface of the transparent member are configured to deviate by a predetermined distance.

2. A lighting apparatus, comprising:
the lens recited in claim 1; and
a light source disposed to face the lens.

3. The lighting apparatus according to claim 2,
wherein the light source comprises two light emitting diode elements,
wherein one of the light emitting diode elements is disposed on the central axis of the Fresnel lens surface provided on the first surface of the transparent member, and
wherein the other of the light emitting diode elements is disposed on the central axis of the Fresnel lens surface provided on the second surface of the transparent member.

4. The lighting apparatus according to claim 2,
wherein the light source is disposed between the central axis of the Fresnel lens surface provided on the first surface of the transparent member and the central axis of the Fresnel lens surface provided on the second surface of the transparent member.

* * * * *